(12) United States Patent
Park

(10) Patent No.: US 8,981,448 B2
(45) Date of Patent: Mar. 17, 2015

(54) VARIABLE RESISTANCE MEMORY DEVICE WITH SHUNT GATE CONNECTED TO CORRESPONDING GATE

(71) Applicant: SK Hynix Inc., Gyeonggi-do (KR)

(72) Inventor: Nam Kyun Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 45 days.

(21) Appl. No.: 13/795,872

(22) Filed: Mar. 12, 2013

(65) Prior Publication Data

US 2014/0166971 A1 Jun. 19, 2014

(30) Foreign Application Priority Data

Dec. 14, 2012 (KR) ................ 10-2012-0146380

(51) Int. Cl.
*H01L 27/108* (2006.01)
*H01L 29/788* (2006.01)
*H01L 27/24* (2006.01)
*H01L 21/8239* (2006.01)
*H01L 29/78* (2006.01)

(52) U.S. Cl.
CPC ........ *H01L 27/2454* (2013.01); *H01L 21/8239* (2013.01); *H01L 29/7827* (2013.01)
USPC .......... 257/302; 257/4; 257/60; 257/288; 257/329; 257/E27.096; 257/E29.262

(58) Field of Classification Search
USPC ........ 257/4, 60, 288, 296, 302, 329, E27.096, 257/E29.118, E29.262
See application file for complete search history.

(56) References Cited

U.S. PATENT DOCUMENTS

| | | | | |
|---|---|---|---|---|
| 5,010,386 | A * | 4/1991 | Groover, III | 257/369 |
| 5,416,350 | A * | 5/1995 | Watanabe | 257/330 |
| 2002/0027802 | A1* | 3/2002 | Noble | 365/154 |
| 2004/0061161 | A1* | 4/2004 | Radens et al. | 257/301 |
| 2010/0233210 | A1* | 9/2010 | Pang et al. | 424/218.1 |
| 2012/0243296 | A1* | 9/2012 | Watanabe et al. | 365/148 |

FOREIGN PATENT DOCUMENTS

| KR | 1020110001409 | 1/2011 |
|---|---|---|
| KR | 1020120050173 | 5/2012 |

* cited by examiner

*Primary Examiner* — Thanh V Pham
(74) *Attorney, Agent, or Firm* — IP & T Group LLP

(57) ABSTRACT

A variable resistance memory device includes a semiconductor substrate having a vertical transistor with a shunt gate that increases an area of a gate of the vertical transistor.

6 Claims, 6 Drawing Sheets

US 8,981,448 B2

VARIABLE RESISTANCE MEMORY DEVICE WITH SHUNT GATE CONNECTED TO CORRESPONDING GATE

CROSS-REFERENCES TO RELATED APPLICATION

This application claims priority under 35 U.S.C. 119(a) to Korean application number 10-2012-0146380 filed on Dec. 14, 2012, in the Korean Patent Office, which is incorporated by reference in its entirety.

BACKGROUND

1. Technical Field

The inventive concept relates to a variable resistance memory device and a method of manufacturing the same, and more particularly, to a variable resistance memory device and a method of manufacturing the same using a transistor as an access device.

2. Related Art

Nonvolatile memory devices have characteristics that data stored therein is not erased even in power off and thus the nonvolatile memory devices have been widely adopted by computers, mobile telecommunication systems, memory cards, and the like.

Flash memory devices have typically been widely used as the nonvolatile memory devices. The flash memory devices typically have memory cells having a stack gate structure. To improve reliability and program efficiency in the flash memory devices, film quality of a tunnel oxide layer has to be improved and a coupling ratio of a cell has to be increased, Currently, next-generation memory devices, for example, phase-change random access memories (PCRAMs), resistance RAMs (ReRAMs), and magentoresistive RAMS (MRAMs) have been suggested.

As typical next-generation memory devices, PCRAMs need an access device configured to selectively provide current to a phase-change resistance layer, Currently, transistors and diodes are mainly used as the access device in the PCRAMs.

However, the transistors have a low threshold voltage, but the transistors occupy a relatively larger area than the diodes. While the diodes occupy a smaller area than the transistors, the diodes have a larger threshold voltage than the transistors. Further, if the diodes are arranged over a word line, then word line bouncing may be caused due to a resistance difference of the word line according to an arrangement position of the diodes.

SUMMARY

According to one aspect of an exemplary embodiment, there is provided a variable resistance memory device. The variable resistance memory device may include: a semiconductor substrate; a plurality of vertical transistors arranged at a fixed interval on the semiconductor substrate; a variable resistive region formed on each of the plurality of vertical transistors; and a shunt gate disposed in a space between adjacent vertical transistors and configured to be electrically connected to a gate of each of the plurality of vertical transistors.

According to another aspect of an exemplary embodiment, there is provided a method of manufacturing a variable resistance memory device. The method may include: forming a plurality of vertical transistors on a semiconductor substrate, each of the plurality of vertical transistors including a pillar and a gate surrounding a lower portion of the pillar; forming a first spacer and a second spacer on a sidewall of the pillar on the gate; burying an insulating layer between the vertical transistors; removing the second spacer disposed on one side of the pillar and an upper portion of the insulating layer to define a space; and burying a conductive material in the space to form a shunt gate.

According to another aspect of an exemplary embodiment, there is provided a semiconductor memory device. The semiconductor memory device may include: gates each surrounding channel pillars; and a shunt gate disposed between the channel pillars and configured to be connected one of adjacent gates to extend an area of the gate.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
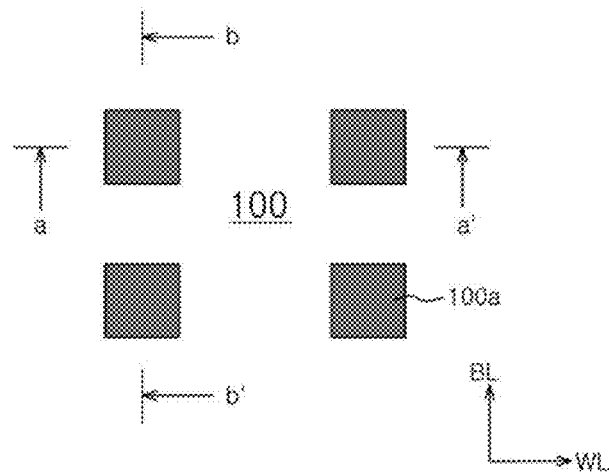
FIG. 1 is a plan view illustrating an arrangement of channel pillars according to an exemplary embodiment.

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

FIG. 1 is a plan view illustrating an arrangement of channel pillars according to an exemplary embodiment. FIGS. 2A and 26, FIGS. 3A and 3B, FIGS. 4A and 4B, FIGS. 5A and 5B, FIGS. 6A and 6B, FIGS. 7A and 7B, and FIGS. 8A and 8B are cross-sectional views illustrating a method of manufacturing an variable resistance memory device. FIGS. 2A, 3A, 4A, 5A, 6A, 7A, and 8A are cross-sectional views taken along line a-a' (a direction parallel to a word line) of FIG, 1 and FIGS. 2B, 3B 4B, 5B, 6B, 7B, and 8B are cross-sectional views taken along line b-b' (a direction parallel to a bit line) of FIG. 1.

Figure 2A:
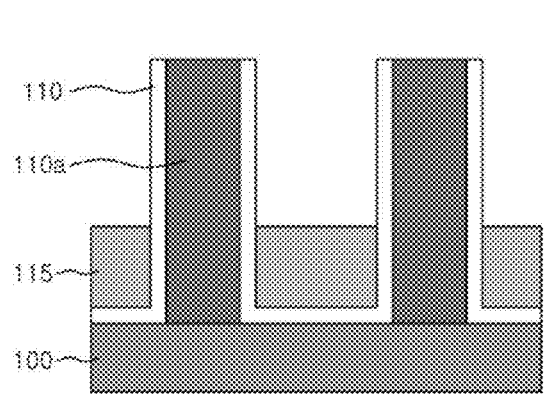
FIGS. 2A and 2B, FIGS. 3A and 3B, FIGS. 4A and 4B, FIGS. 5A and 5B, FIGS. 6A and 6B, FIGS. 7A and 7B, and FIGS. 8A and 8B are cross-sectional views illustrating a method of manufacturing an exemplary variable resistance memory device.
Figure 2B:
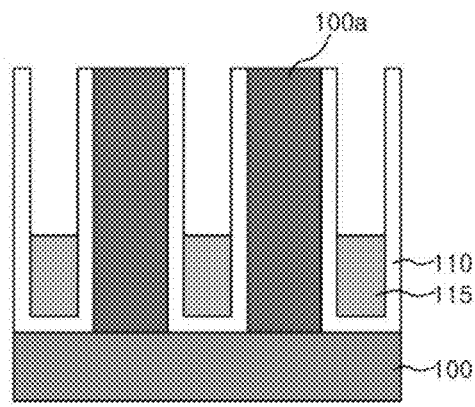

Referring to FIGS. 1, 2A, and 2B, a portion of a semiconductor substrate 100 is etched to form pillars 100a. The pillars 100a may be disposed in a matrix as illustrated in FIG. 1. An upper region of each of the pillars 100a becomes a drain region, the semiconductor substrate 100, connecting each of the pillars 100a, becomes a common source region of an access device, and a portion of each of the pillars 100a, between the drain region and the common source, becomes a channel region of the access device. The drain region and the common source region may be formed and defined through a separate impurity implantation process.

A first insulating layer 110 is deposited on surfaces of the pillars 100a and the semiconductor substrate 100 and then a second insulating layer 115 may be formed in a space between the pillars 100a. The second insulating layer 115 is anisotropically over-etched to remain only in a lower portion of the space between each of the pillars 100a. The second insulating layer 115, remaining in the space between the pillars 100a, may define a height of a main gate to be formed later. At this time, the first insulating layer 110 and the second insulating layer 115 on an upper surface of each pillar 100a may be removed through the anisotropic etching process of the second insulating layer 115.

Figure 3A:
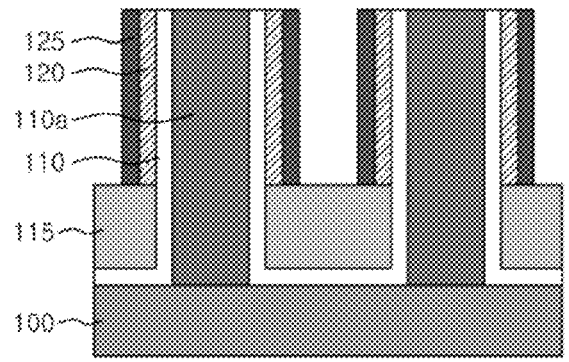
Figure 3B:
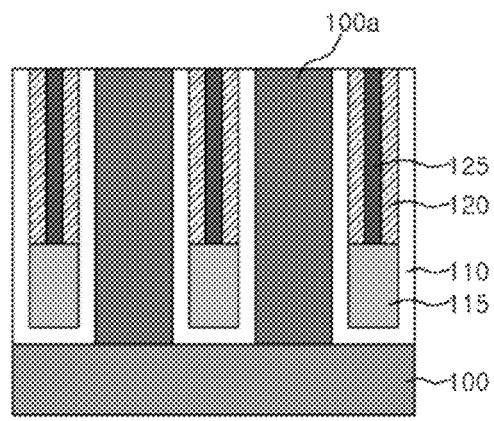

Referring to FIGS. 3A and 3B, a first spacer 120 and a second spacer 125 are formed on a side of the first insulating layer 110, which is formed on a sidewall of each of the pillars 100a. The first spacer 120 and the second spacer 125 may include an insulating layer and may be formed sequentially or simultaneously. Here, the first spacer 120 serves to protect the first insulating layer 110 surrounding each of the pillars 100a and the second spacer 125 may be a sacrificial layer for defining a shunt gate to be formed later. The first spacer 120 and the second spacer 125 may be formed of a material having an etch selectivity that is higher than an etch selectivity of the material that forms the second insulating layer 115.

Figure 4A:
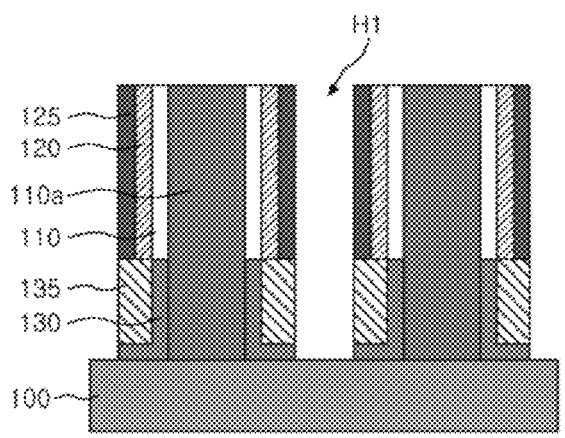
Figure 4B:
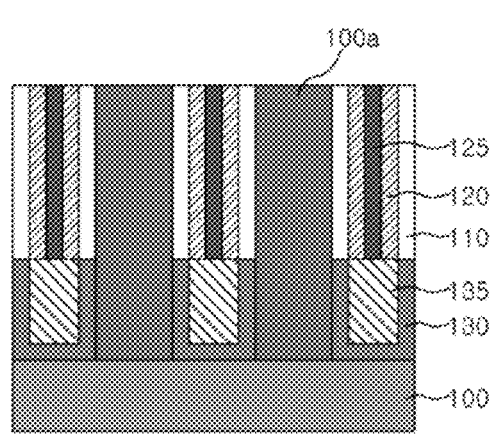

Referring to FIGS. 4a and 4B, the second insulating layer 115, exposed by the first spacer 120 and the second spacer 125 is selectively removed. A wet etch method may be used to selectively remove the second insulating layer 115. By removing the second insulating layer 115, a sidewall of a lower portion of each of the pillars 100a and a surface of the semiconductor substrate 100 is exposed.

Next, a gate insulating layer 130 is formed along the exposed sidewall of each of the pillars 100a and the exposed surface of the semiconductor substrate 100 and a gate electrode material is formed within a spacer surrounded by the gate insulating layer 130. For example, the gate electrode material may include a metal, such as selected from the group consisting of tungsten (W), copper (Cu), titanium nitride (TIN), tantalum nitride (TaN), tungsten nitride (WN), molybdenum nitride (MoN) niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium (Ti), molybdenum (Mo) tantalum (Ta), titanium silicide (TiSi), titanium tungsten (Ti), titanium oxynitride (TiON), titanium aluminum oxynitride (TiAlON), tungsten oxynitride (WON), or tantalum oxynitride (TaON). Alternatively, the gate electrode material may include a semiconductor, such as doped polysilicon or silicon germanium (SiGe).

Next, the gate electrode material and the gate insulating layer 130 are patterned using the second spacer 125 as a mask to define a main gate (or surround gate) 135. In FIG. 4A, H1 is a space between main gates 135 when viewed in a word line direction.

Figure 5A:
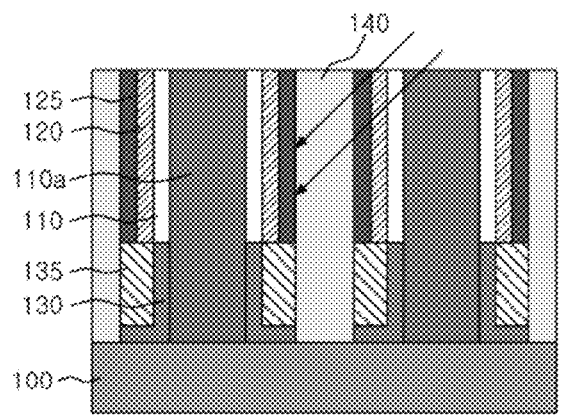
Figure 5B:
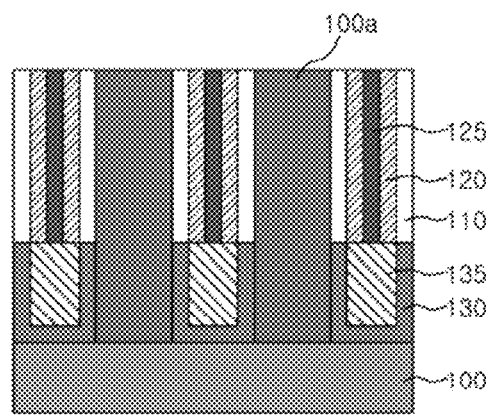

Referring to FIGS. 5A and 5B, a third insulating layer 140 is buried in the space H1 between the gate electrodes 135. A tilted ion implantation process is performed to implant impurity ions into the second spacer 125, which is formed perpendicular to the semiconductor substrate 100. The tilted ion implantation process uses various ions, such as argon (Ar) ion and hydrogen (H), and damages the second spacer 125. At this time, an upper region of the third insulating layer 140 is also damaged by the tilted ion implantation process.

Figure 6A:
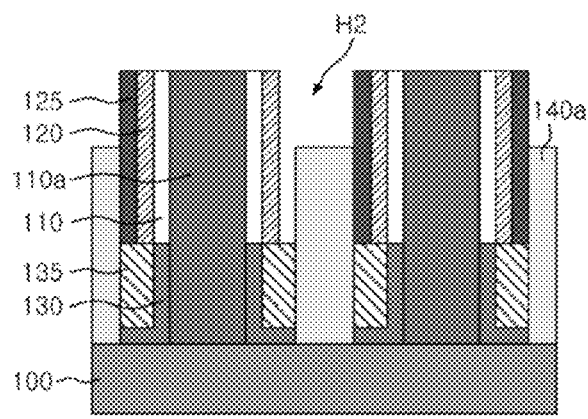
Figure 6B:
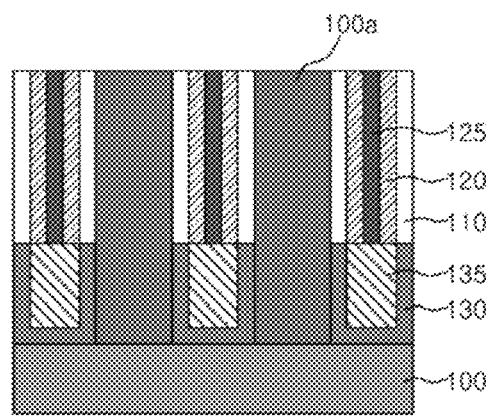

Referring to FIGS. 6A and 6B, the second spacer 125 and the third insulating layer 140, which have been damaged by the tilted ion implantation process, are selectively removed to define a shunt gate formation region H2, As is generally known, an etch rate in a material may be varied according to a degree of damage by ion implantation. In the exemplary embodiment, the damaged second spacer 125 and the damaged portion of the third insulating layer 140 are selectively removed based on the degree of damage to define a shunt gate formation region H2. The shunt gate formation region H2 exposes the main gate 135. The reference numeral 140a denotes a remaining third insulating layer.

Figure 7A:
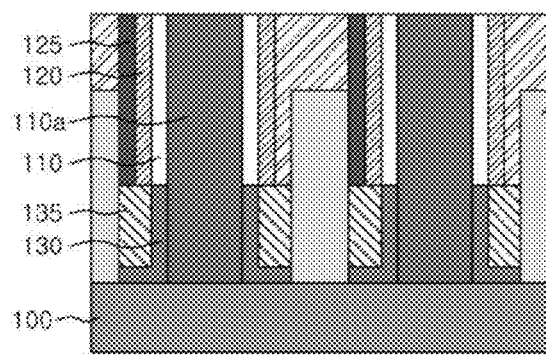
Figure 7B:
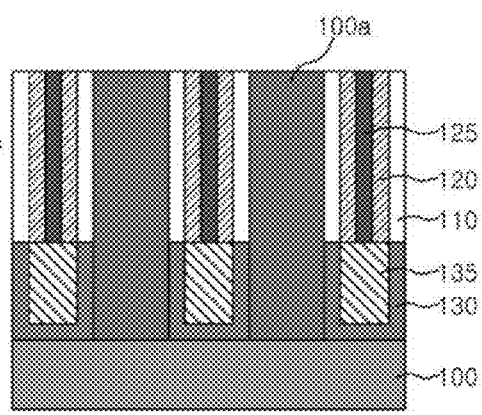

Referring to FIGS. 7A and 7B, a conductive material is provided in the shunt gate formation region H2 to form a shunt gate 145 that is in contact with the main gate. The conductive material may include, for example, W, Cu, TiN, TaN, WN, MoN NbN, TiSiN, TiAlN, TiBN, ZrSiN, WSiN, WBN, ZrAlN, MoSiN, MoAlN, TaSiN, TaAlN, Ti, Mo, Ta, TiSi, TiW, TiON, TiAlON, WON, or TaON. Alternatively, the conductive material may include a semiconductor, such as doped polysilicon layer or silicon germanium (SiGe). The shunt gate 145 is electrically connected to the main gate 135 to extend an area of the main gate 135 and thus, reduce total gate resistance.

Figure 8A:
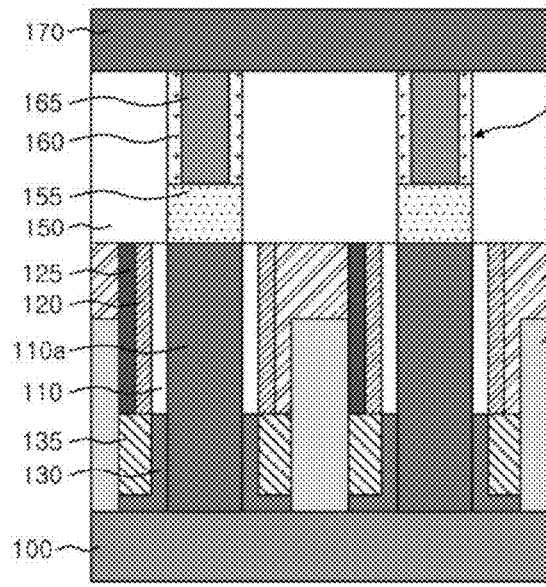
Figure 8B:
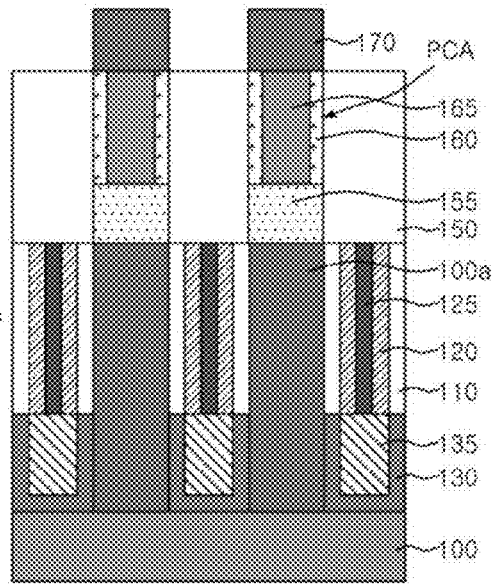

Referring to FIGS. 8A and 8B, an interlayer insulating layer 150 is formed on the semiconductor substrate on which the shunt gate 145 is formed and then etched to expose each of the pillars 100a. Therefore, a variable resistive region PCA is defined. A heating electrode 155 is formed in a lower portion of the variable resistive region PCA through a conventional method. A heat-endurance spacer 160 is formed on a sidewall of the variable resistive region PCA. A variable resistive layer 165 is formed in the variable resistive region PCA. At this time, the variable resistive layer 165 may include a PCMO layer, which is a material for a ReRAM, a chalcogenide layer, which is a material for a PCRAM, a magnetic layer, which is a material for a MRAM, a magnetization reversal device layer, which is a material for a spin-transfer torque magnetoresistive RAM (STTMRAM) or a polymer layer, which is a material for a polymer RAM (PoRAM). A bit line 170 is formed on the semiconductor substrate including the variable resistive layer 165.

According to the exemplary embodiment, the variable resistance memory device uses a vertical transistor, having a surround gate structure surrounding a pillar, as an access device to provide a low threshold voltage and to reduce an area of the access device as compared with a transistor in the related art.

Further, the shunt gate connected to the surround gate is formed in the space between the pillars so that a gate area is increased to reduce gate resistance and word line resistance is improved to reduce word line bouncing.

The shunt gates are disposed with the pillar, the first insulating layer 110, and the first spacer 120 interposed therebetween to have a sufficient insulating layer thickness. Therefore, capacitance characteristic can be also improved and the word line bouncing can be further reduced.

Figure 9:
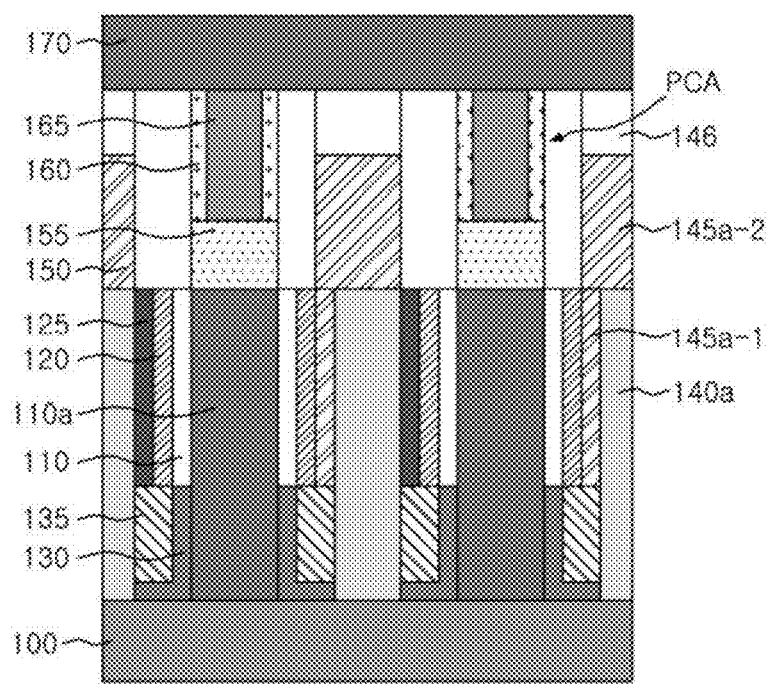
FIGS. 9 and 10 are cross-sectional views illustrating exemplary variable resistance memory devices.

As illustrated in FIG. 9, a first portion 145a-1 of a shunt gate and a second portion 145a-2 of the shunt gate may be formed to extend between variable resistive regions PCA. The first portion 145a-1 of the shunt gate extends in a space between each of the pillars 100a, and the second portion 145a-2 of the shunt gate extends in a space between variable resistive layers 165. Thus, the second portion 145a-2 of the shunt gate is entirely disposed between variable resistive layers 165. Moreover, the second portion 145a-2 of the shunt gate is wider than the first portion 145a-1 of the shunt gate in a direction parallel to the surface of the substrate. According to the exemplary embodiment, an area of a gate electrode can be increased by the first portion 145a-1 of the shunt gate and the second portion 145a-2 of the shunt gate.

Figure 10:
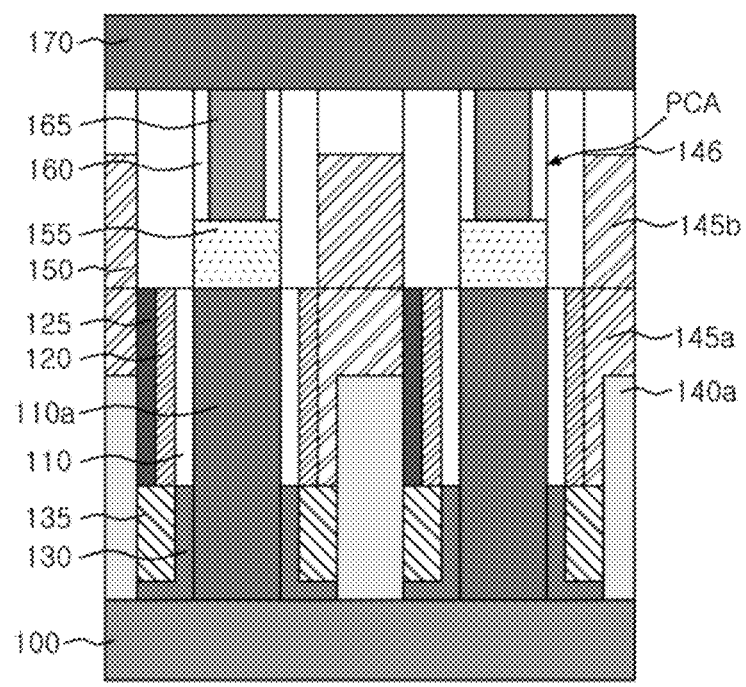

As illustrated in FIG. 10, a first portion 145a of a shunt gate a second portion 145b of the shunt gate may be formed to extend between variable resistive regions PCA. The first portion 145a of the shunt gate extends in a space between each of the pillars 100a, and the second portion 145b of the shunt gate extends in a space between each of the pillars 100a and between the variable resistive layers 165. Moreover, the second portion 145b of the shunt gate is wider than the first portion 145a of the shunt gate in a direction parallel to the surface of the substrate. According to the exemplary embodiment, an area of a gate electrode can be increased by the first portion 145a-1 of the shunt gate and the second portion 145a-2 of the shunt gate.

After the shunt gate 145 is formed as in the exemplary embodiment, the portion of the shunt gate disposed between the variable resistive layers 165 may be formed by forming an additional conductive layer and patterning the additional conductive layer to be electrically connected to the shunt gate 145, so that the extending shunt gates 145a-1 and 145a-2 and 145a and 145b may be formed. Here, the reference numeral 146 is a hard mask for defining the shunt gate disposed between the variable resistive layers 165 and the reference numeral 170 denotes a bit line.

The above exemplary embodiment is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A variable resistance memory device, comprising:
   a semiconductor substrate having a length and a width;
   a plurality of vertical transistors, extending from a surface of the semiconductor substrate in a direction perpendicular to the length and the width of the semiconductor substrate, the plurality of vertical transistors being arranged at a fixed interval on the semiconductor substrate;
   a variable resistive region formed on each of the plurality of vertical transistors; and
   a shunt gate disposed in a space between adjacent vertical transistors and configured to be electrically connected to a gate of each of the plurality of vertical transistors.

2. The variable resistance memory device of claim 1, wherein each of the plurality of vertical transistors includes:
   a pillar extending from the surface of the semiconductor substrate in the direction perpendicular to the length and the width of the semiconductor substrate; and
   a surround gate to surround a lower region of the pillar.

3. The variable resistance memory device of claim 2, wherein the shunt gate is to connect to an adjacent surround gate.

4. The variable resistance memory device of claim 1, wherein the shunt gate extends from the surface of the semiconductor substrate in the direction perpendicular to the length and the width of the semiconductor substrate, the shunt gate including:
   a first portion to contact the adjacent surround gate, and
   a second portion, connected to the first portion, wherein the second portion is wider than the first portion in a direction parallel to the surface of the semiconductor substrate.

5. The variable resistance memory device of claim 4, wherein the second portion extends in a space between the variable resistive regions.

6. The variable resistance memory device of claim 4, wherein an insulating spacer is interposed between the first portion and the pillar.

\* \* \* \* \*